US009483585B2

(12) United States Patent
Delvordre et al.

(10) Patent No.: US 9,483,585 B2
(45) Date of Patent: Nov. 1, 2016

(54) DESIGNING A STAGGERED PATTERN OF OBJECTS IN A COMPUTER-AIDED DESIGN SYSTEM

(75) Inventors: Jean-Louis Delvordre, Rueil-Malmaison (FR); Ameya Divekar, Pune (IN); Sameer Kulkarni, Pune (IN)

(73) Assignee: Dassault Systèmes, Velizy Villacoublay (FR)

( * ) Notice: Subject to any disclaimer, the term of this patent is extended or adjusted under 35 U.S.C. 154(b) by 598 days.

(21) Appl. No.: 13/460,210

(22) Filed: Apr. 30, 2012

(65) Prior Publication Data
US 2012/0290270 A1   Nov. 15, 2012

(30) Foreign Application Priority Data
May 11, 2011   (EP) .................................... 11305565

(51) Int. Cl.
*G06F 17/50*   (2006.01)
*G06T 19/20*   (2011.01)

(52) U.S. Cl.
CPC .............. *G06F 17/50* (2013.01); *G06T 19/20* (2013.01); *G06T 2219/2004* (2013.01)

(58) Field of Classification Search
CPC .................. G06F 17/50; G06T 19/20; G06T 2219/2004; G06T 2219/2021
USPC .......................................................... 703/1
See application file for complete search history.

(56) References Cited

U.S. PATENT DOCUMENTS

2008/0301572 A1   12/2008 Wengler
2014/0136156 A1*  5/2014 Divekar et al. ................... 703/1

OTHER PUBLICATIONS

Steven G. Smith: "Pattern Relations", *Pro/E The Magazine—CADquest Article Series*, pp. 1-4 (Jun. 1998).
Anonymous: "Pattern features", *Solid Edge Velocity Series—Constructing procedural features*, pp. 4-1 through 4-41 (Jan. 2010).
Anonymous: "Example: Pattern Driven by a Relation", *ProEngineer Help*, pp. 1-3 (Feb. 12, 2002).
Anonymous: "Appendix F—Activity: Fill Pattern", *Solid Edge Velocity Series—Constructing procedural features*, pp. F1-F24 (Oct. 5, 2010).
European Search Report in European Patent Application No. 11305565.1 dated Mar. 2, 2012.

* cited by examiner

*Primary Examiner* — Aniss Chad
(74) *Attorney, Agent, or Firm* — Hamilton, Brook, Smith & Reynolds, P.C.

(57) ABSTRACT

It is proposed a computer-implemented method for designing a staggered pattern of objects in a computer-aided design system, the method comprising the steps of:
  providing a reference object to be multi-instantiated;
  instantiating objects from the reference object for forming a grid with a number of rows and a number of columns, the grid being formed so that the rows are spaced from each other with a first distance in a first direction and each column being spaced from each other with a second distance in a second direction;
  shifting, in one of every two rows of the grid, the instantiated objects of all the columns of said one of every two rows of the grid with a third distance in the second direction.

13 Claims, 6 Drawing Sheets

DESIGNING A STAGGERED PATTERN OF OBJECTS IN A COMPUTER-AIDED DESIGN SYSTEM

RELATED APPLICATION(S)

This application claims priority under 35 U.S.C. §119 or 365 to European Patent Application No. 11305565.1, filed May 11, 2011.

The entire teachings of the above application(s) are incorporated herein by reference.

FIELD OF THE INVENTION

The invention relates to the field of computer programs and systems, and more specifically to a method, system and program for designing a staggered pattern of objects.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behaviour of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

CAD systems provide an intuitive and flexible user interface for designing precise 3D mechanical parts, from sketching in an assembly context to iterative detailed design. Such a solution is provided by CATIA Part Design (trademark) application which combines the power of feature-based design with the flexibility of a Boolean approach, offers a highly productive and intuitive design environment with multiple design methodologies, such as post-design and local 3D parameterization.

During the process of mechanical parts design, the designer may need to create several identical features from an existing one and to simultaneously position them on a part. To this aim, the designer generally uses patterns that allow to duplicate an original feature at a location chosen in the part by the designer. Common patterns are rectangular pattern and circular pattern. The designer may also need a particular pattern (also referred to as user pattern) that is created by hand by the designer. For instance, the designer selects a set of points on which the original feature will be duplicated.

Figure 4:
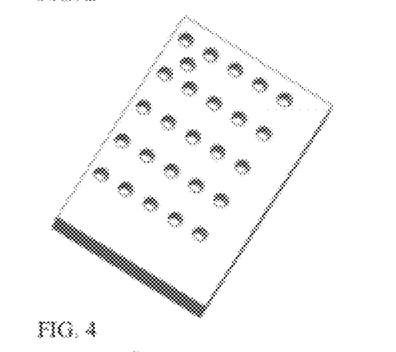
Figure 5:
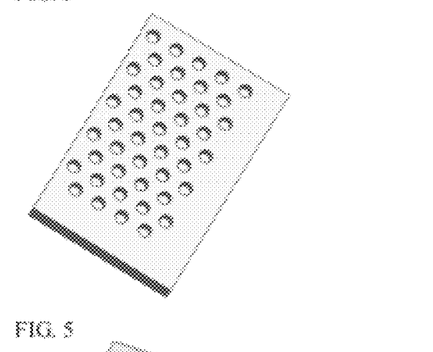

The creation of a staggered pattern of objects requires performing several steps, as illustrated on FIGS. 2 to 5. First, the designer creates an initial part comprising a feature; for instance, on FIG. 2, a pad (200) comprises a hole (202). Then, as shown on FIG. 3, the designer creates a duplicate reference feature (204) of the reference feature (202) and defines an offset (206) between the duplicated feature (204) and the reference feature (202). Next, the designer creates a first pattern for duplicating the reference feature according to a rectangular pattern (FIG. 4). Then, the designer creates a second pattern for duplicating the duplicate reference feature according to a rectangular pattern. Finally, the first and second patterns are combined for obtaining the requested staggered pattern, as illustrated on FIG. 5.

The creation of a staggered pattern of objects can also be performed by using a user pattern. It consists in creating a sketch of point representing each location of duplicated reference features, and creating a pattern by selecting a reference feature to duplicate and the sketch of points. Again, several steps are required.

Figure 6:
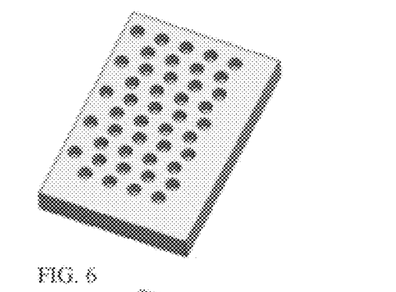
FIGS. 6 to 8 are illustrations of the modification of a staggered pattern of objects as known in the prior art.
Figure 7:
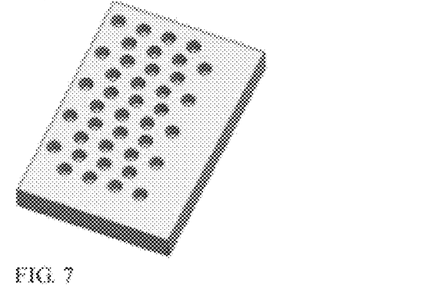
Figure 8:
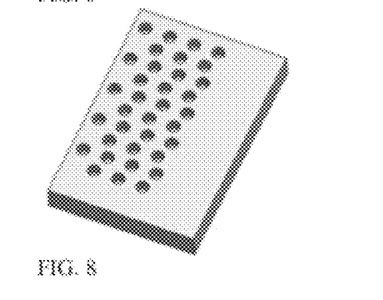

Likewise, the modification of a pattern requires the designer to perform several steps. For instance, starting from a staggered pattern of objects as the one illustrated on FIG. 5, the designer has to modify the offset of the duplicate reference feature (such as the duplicate reference feature 204 in FIG. 3) in relation with reference feature (such as the reference feature 202 in FIG. 3), as shown on FIG. 6. Then, the designer has to edit the first and second patterns and reduce the number of instances of the reference feature, as illustrated on FIGS. 6 and 7. Finally, the modified part is obtained, as shown on FIG. 8.

The creation and the modification of a staggered pattern of objects thus require the designer to perform several steps. It requires added actions to create the geometry (e.g. creation of an offset, creation of two patterns, or creation of sketch), which is a cumbersome task and time consuming as well.

Within this context, there is still a need for an improved method for designing a staggered pattern of objects in a computer-aided design system.

SUMMARY OF THE INVENTION

According to one aspect, the invention therefore provides a computer-implemented method for designing a staggered pattern of objects in a computer-aided design system, the method comprising the steps of:
   providing a reference object to be multi-instantiated;
   instantiating objects from the reference object for forming a grid with a number of rows and a number of columns, the grid being formed so that the rows are spaced from each other with a first distance in a first direction and each column being spaced from each other with a second distance in a second direction;
   shifting, in one of every two rows of the grid, the instantiated objects of all the columns of said one of every two rows of the grid with a third distance in the second direction.

The method may comprise one or more of the following: the steps of:
   determining the respective position of each instantiated object in the staggered pattern;

activating each instantiated object whose respective position is comprised in a set of predetermined positions;

the set of predetermined positions is enclosed in a bounding volume;

the set of predetermined positions further comprises the positions of the instantiated objects for which the instantiated objects are totally enclosed in the said bounding volume;

the set of predetermined positions further comprises the positions of the instantiated objects for which each instantiated object is enclosed in a bounding volume that is totally enclosed within said bounding volume;

defining the number of objects to be instantiated from the reference object;

displaying the grid with a number of rows and a number of columns before the step of shifting;

shifting the instantiated objects previously shifted with the third distance in a third direction opposite to the second direction;

shifting the instantiated objects previously shifted with a fourth distance in a third direction opposite to the second direction, wherein the fourth distance is twice the third distance;

assigning a value to at least one of the first, second, third and fourth distance;

after the step of shifting, the step of displaying the instantiated objects.

The invention further proposes a computer program comprising instructions for execution by a computer, the instructions comprising means for performing the steps of the above method.

The invention further proposes a computer readable storage medium having recorded thereon the above computer program.

The invention further proposes a computer-aided design system comprising:

a storage system for storing a reference object to be multi-instantiated;

a graphical user interface for displaying a user-interactive graphical tool, the user-interactive graphical tool being adapted for triggering upon user action the designing of a staggered pattern of objects according to the above method.

BRIEF DESCRIPTION OF THE DRAWINGS

Embodiments of the invention will now be described, by way of non-limiting example, and in reference to the accompanying drawings, where.

DETAILED DESCRIPTION OF THE INVENTION

It is proposed a computer-implemented method for designing a staggered pattern of objects in a computer-aided design (CAD) system. The method comprises a step of providing a reference object to be multi-instantiated. The reference object can be a three dimensional modeled object also referred to as a CAD object. The method further comprises a step of instantiating objects from the reference object for forming a grid with a number of rows and a number of columns, each row being spaced from each other with a first distance in a first direction and each column being spaced from each other with a second distance in a second direction. The instantiation of an object is performed as known in the art. The instantiation create an instance by defining one particular variation of the reference object. Typically, the reference object is a file comprising data representing a modeled object (e.g. the hole feature 202 on FIG. 2), and the reference object instantiated is an executable file that can be used by a CAD system (e.g. for displaying the hole feature 202 on FIG. 2). The instantiated reference object is thus stored in memory and can be accessed and used by the CAD system. Forming a grid with rows and column means that the instances of the reference object are regularly located on intersections of a network of uniformly spaced horizontal and perpendicular lines (the rows and columns). The intersections are the points wherein the horizontal lines cross the perpendicular lines. The method further comprises a step of shifting, in one of every two rows of the grid, the instantiated objects of all the columns of said one of every two rows of the grid with a third distance in the second direction. Shifting the instantiated objects means that they are moved from a first position to a second position along a line of the grid (e.g. along a row), the space between the instances of the reference object being preserved.

Such a method improves the creation of a staggered pattern of objects. Indeed, the designer does not need to construct and put together patterns for creating a staggered pattern. The number of interaction between the user and the CAD system decreases in comparison with the background art. Thus, the method according to the invention improves the time required for creating a staggered pattern of objects. In addition, fewer resources such as memory or central processing unit (CPU) are required for the creation of the staggered pattern of objects inasmuch as the number of operations performed by the CAD system is limited. Furthermore, the method makes it possible to keep specifications of the duplicated features inasmuch as the specifications of the reference object to be duplicated are inherited by the instantiated object. For instance, the instance of a through hole located on a support (e.g. a pad) will be kept as a through hole even if the support on with the through hole is duplicated is thicker at other location.

The method is computer-implemented. This means that the steps (or substantially all the steps) of the method are executed by at least one computer. In examples, the triggering of at least some of the steps of the method may be performed through user-computer interaction. The level of user-computer interaction required may depend on the level of automatic functioning foreseen and put in balance with the need to implement the user's wishes. In examples, this level may be user-defined and/or pre-defined.

For instance, the step of defining the number of objects to be instantiated can be performed upon an input of the user.

A typical example of computer-implementation of the method is to perform the method with a computer-aided design (CAD) system comprising a graphical user interface (GUI) suitable for this purpose. The GUI is coupled with a memory and a processor. The memory, which stores a database, is merely any hardware suitable for such storage, also referred to as storage system. Such a CAD system improves the design of a staggered pattern of objects: less time and hardware resources are required for designing a staggered pattern of objects in comparison with the prior art.

By "database" or "storage system", it is meant any collection of data (i.e. information) organized for search and retrieval. When stored on a memory, the database allows a rapid search and retrieval by a computer. Databases are indeed structured to facilitate storage, retrieval, modification, and deletion of data in conjunction with various data-processing operations. The database may consist of a file or set of files that can be broken down into records, each of which consists of one or more fields. Fields are the basic units of data storage. Users may retrieve data primarily through queries. Using keywords and sorting commands, users can rapidly search, rearrange, group, and select the field in many records to retrieve or create reports on particular aggregates of data according to the rules of the database management system being used.

In the case of the method, the database can comprise a reference object to be multi-instantiated.

The method generally manipulates modeled objects. A modeled object is any object defined by data stored in the database. By extension, the expression "modeled object" designates the data itself. According to the type of the system, the modeled objects may be defined by different kinds of data.

By CAD system, it is meant any system suitable at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

A CAD system may be history-based. In this case, a modeled object is further defined by data comprising a history of geometrical features. A modeled object may indeed be designed by a physical person (i.e. the designer/user) using standard modeling features (e.g. extrude, revolute, cut, and/or round etc.) and/or standard surfacing features (e.g. sweep, blend, loft, fill, deform, smoothing and/or etc.). Many CAD systems supporting such modeling functions are history-based system. This means that the creation history of design features is typically saved through an acyclic data flow linking the said geometrical features together through input and output links The history based modeling paradigm is well known since the beginning of the 80's. A modeled object is described by two persistent data representations: history and B-rep (i.e. boundary representation). The B-rep is the result of the computations defined in the history. The shape of the part displayed on the screen of the computer when the modeled object is represented is (a tessellation of) the B-rep. The history of the part is the design intent. Basically, the history gathers the information on the operations which the modeled object has undergone. The B-rep may be saved together with the history, to make it easier to display complex parts. The history may be saved together with the B-rep in order to allow design changes of the part according to the design intent.

Figure 17:
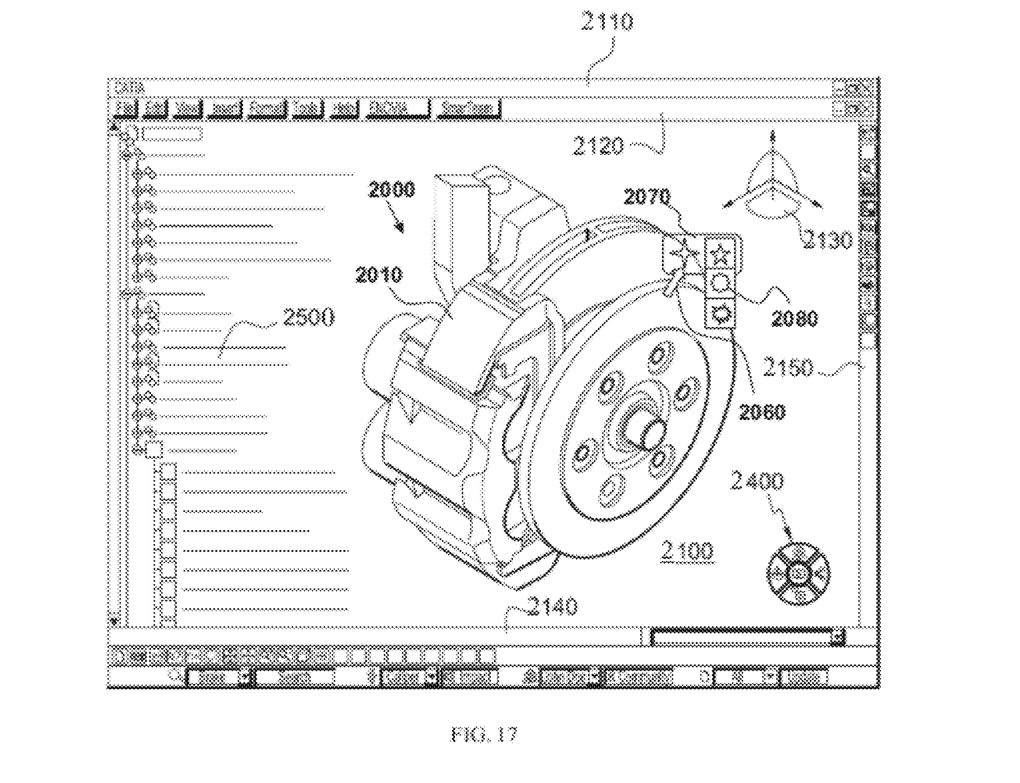
FIG. 17 shows an example of a graphical user interface.

FIG. 17 shows an example of the GUI of the system, wherein the system is a CAD system.

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 17, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 18:
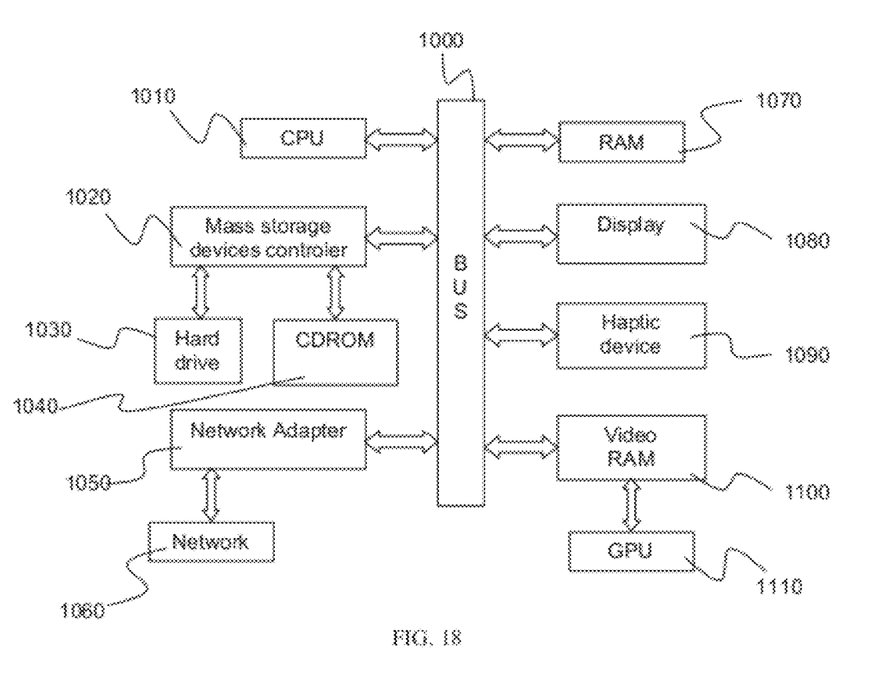
FIG. 18 shows an example of a client computer system.

FIG. 18 shows a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080, as mentioned with reference to FIG. 18. In addition, the cursor control device allows the user to select various commands, and input control signals. The cursor control device includes a number of signal generation devices for input control signals to system. Typically, a cursor control device may be a mouse, the button of the mouse being used to generate the signals.

A computer program may comprise instructions by a computer, the instructions comprising means for causing the above system to perform the above method. The invention may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output.

The invention may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language or in assembly or machine language if desired; and in any case, the language may be a compiled or interpreted language.

Figure 1:
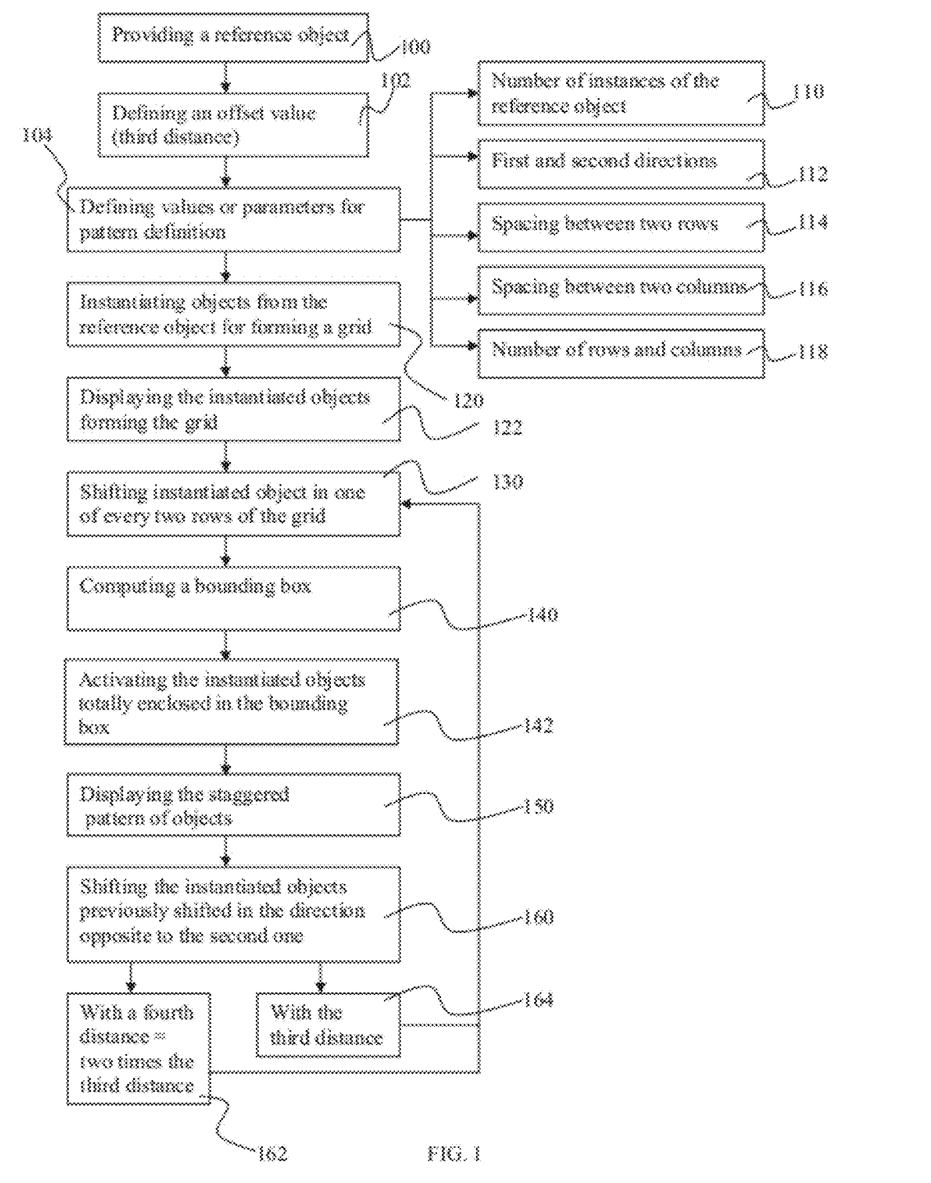
FIG. 1 shows a flowchart of an example of the method.
Figure 2:
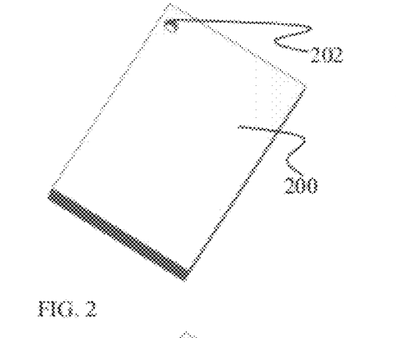
FIGS. 2 to 5 are illustrations of the creation of a staggered pattern of objects as known in the prior art.
Figure 3:
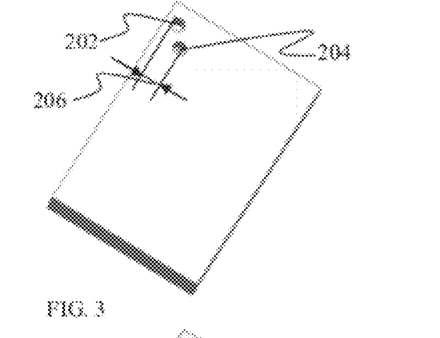

Referring now to FIG. 1, a reference object to be multi-instantiated is provided 100, which involves that the reference object is now available for the CAD system; e.g. the CAD systems can instantiate the reference object and store the instantiated reference object in memory. In other term, a reference object is selected and transferred to the CAD system that can perform operation on it. The selection of the reference object can be performed as known in the art. For instance, this may be done thanks to the use of a tree, such as the one 2500 of FIG. 17. It is also possible for the user to select the reference object thanks to another type of user interface, for instance by inputting identification information for the reference object, by selecting the reference object in a list, or the like. The reference object may be selected thanks to any kind of user interface such as a combo-box, an icon, a special command, and so on.

At next step, an offset value is defined 102. Defining an offset value means that a value is assigned to a distance. The offset value can be a numeric value that is assigned upon user action through a graphical user interface. The offset value can also be defined by default by the CAD system. The offset value allows performing the shifting step 130 that is described below.

Next, values defining parameters of the grid are defined 104, that is, assigned. These values of parameters can be inputted or selected upon user action through a graphical user interface, or they can be assigned by default by the CAD system. The term parameter means an arbitrary constant. Among these values of parameters, it can be defined the number of instances of the reference object to be multi-instantiated 110, the number of rows and columns of the grid to be formed 118, a first and a second directions 112, a distance between two successive rows of a grid 114, and a distance between two successive columns of a grid 116. It is to be understood that these values of parameters can be modified at any step of the process.

Then, at step 120, the reference object is instantiated for forming (or creating) a grid of instantiated objects. The number of reference objects to be instantiated is a parameter value defined at step 110. At step 110, the number of instances of the reference object is defined by the designer, or the system provides a default value of a number of instances to compute. The instantiated objects are forming a grid having a number of rows and a number of columns; in other terms, a network of uniformly spaced horizontal and perpendicular lines (the rows and columns) is created. The grid is formed so that the rows are spaced from each other with a first distance in a first direction and the columns are spaced from each other with a second distance in a second direction. The grid forms a regular pattern, the regular pattern having an axis of symmetry. The intersection of the rows and columns of the grid are used as locating points on which the instantiated objects are positioned. In practice, the rows are perpendicular to the columns: the rows and columns intersect perpendicularly. The respective number of rows and columns is defined at step 118 by the user, or by the system that provides a default value. It is to be understood the number of objects to be instantiated is in connexion with the number of rows and columns of the grid, and inversely. Therefore, when the numbers of rows and columns are set, the number of instances of the reference object is automatically set. And when the number of instances of the reference object is set, the number of rows and columns cannot be freely chosen.

The formation of the grid is preferably performed from a reference point: both the first distance between two consecutive rows and the second distance between two consecutive columns are determined compared with the reference point. In practice, the reference point is a corner point of the grid.

The first and second distances are defined at the former steps 114 and 116. Preferably, the distances are represented by numerical values in relation with unit length (e.g. metric system, imperial system, number of pixels, etc . . . ).

Furthermore, the creation of the grid is performed according to first and second directions. The direction conducts the construction of the grid in a space (e.g. a two-dimensional space or three-dimensional space) in comparison to the reference point.

Next, at step 122, the instantiated objects are displayed on the grid, which amounts to say that a regular pattern of object is displayed. A regular pattern of object is a pattern with the instances of the reference object along two axes and such that the instances are spaced at a constant distance. The constant distance may be defined by the user. The reference point of the grid is an instance of the selected reference object.

Then, at step 130, the instantiated objects of all the columns of one of every two rows of the grid are shifted: all the instantiated objects on a row are moved from a first position to a second position along the row they belong. The shifting of all the instantiated objects on a row is performed in comparison to the reference point and according to a third distance. The third distance can be the offset value defined at step 102. Thus, the new position of an instantiated object (that is, the position of the instantiated object after the shifting) is individually computed according to the position of the reference point and the offset value. This allows to change easily from a first to a second staggered pattern of objects: indeed, the modification of the offset value is made easier because the reference point is unchanged while computing the new offset. As the shifting is computed from the position of the reference point, the space between the instantiated objects on a row is preserved and is the same before and after the shifting step.

Figures 9, 10, 11:
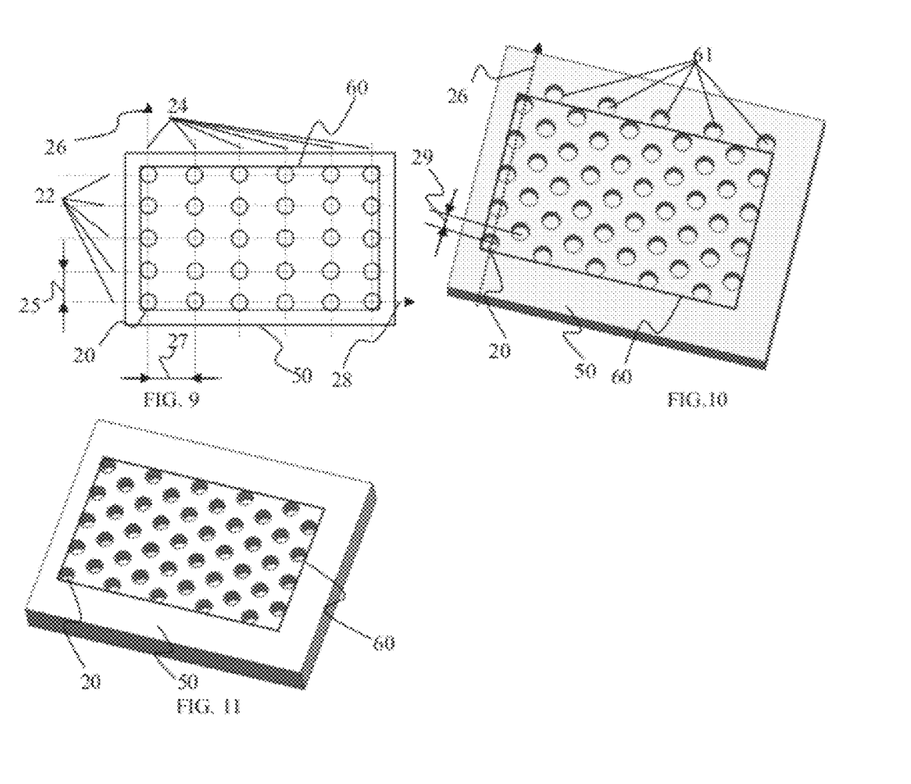
FIG. 9 illustrates a regular pattern of objects.
FIGS. 10 and 11 are illustrations of the creation of a configuration of a staggered pattern of objects according to the invention.

Referring now to FIG. 9, the step 122 of displaying the instantiated objects forming a grid is illustrated. The reference point 20 comprises one of the instantiated reference object. The selected reference object has been instantiated thirty times, and thirty instances of the selected reference object form the grid comprising six rows 24 (represented in dotted lines) and five columns 22 (represented in dotted lines). The thirty instances of the reference object are positioned on a respective intersection of a row with a column. The grid can be placed on a support. The support can be a two-dimensional object or a three dimensional object. In FIG. 9, the support is a three-dimensional pad 50 having the shape of a rectangular cuboid. Each row of the grid is formed according to a first direction 28 and a first distance 27 between each instantiated object of the row. The first direction 28 is determined in relation to the reference point 20 so that it is possible to determine a line starting from the reference point on which the instantiated objects are positioned. The first direction can be characterized by a vector defined by the user. Each object on the row is spaced by the first distance 27 that is the same between all the objects on a row of the grid. Similarly, each column of the grid is formed according to a second direction 26 and a second distance 25 between each instantiated object of the column. The second direction 26 is also determined in relation to the reference point 20 so that it is possible to determine a line starting from the reference point on which the instantiated objects are positioned. The second direction can be characterized by a vector defined by the user. The objects on the column are spaced by the second distance 25 that is the same between all the objects on a column of the grid.

Referring now to FIG. 10, the result of step 130 of the method depicted on FIG. 1 is shown. The pad 50 and the grid are the same as those shown on FIG. 9, but there are now shown with another viewpoint. One of every two rows of the grid is shifted in the second direction 26 with a third distance 29 (the offset defined at step 102).

Referring back to the flowchart of FIG. 1, the staggered pattern of objects obtained at step 130 is not regular, as shown on FIG. 10. Indeed, the instantiated objects 61 are outside an initial rectangular pattern 60 surrounding the instantiated objects before the step of shifting, as shown on FIG. 9. In order to produce a regular pattern, a bounding box is computed at step 140. The bounding box encloses totally or partially the staggered pattern of objects obtained at step 130. The instantiated objects outside the bounding box are created, but they are not activated or de-activated. Typically, the bounding box is defined based on the initial rectangular pattern 60.

In practice, determining whether or not an instantiated object is inside or outside the bounding box is carried out based on the object's position in the staggered pattern of objects. To this aim, the position of each instantiated object is determined. This is performed as known in the art: the position of an instantiated object in the referential of the support can be used. The position of the instantiated object can be the locating point formed by the intersection of the row and the column. Advantageously, determining the position is costless in term of computing resources because the position is always known by the CAD system that does not need to compute it. Then, a comparison is performed between the determined position of the instantiated object and a set of predetermined positions which are allowed positions for the instantiated object. In practice, the set of predetermined position comprises the positions enclosed by a bounding volume enclosing partially or totally the staggered pattern of objects of step 130. The bounding volume may be, but is not limited to, a bounding box. The position of an instantiated object can be computed according a specific point of the object. If the position of the instantiated object is comprised in the set of positions determined with the bounding volume, the object can be created and activated (step 142). This amounts to say that if the position of the instantiated object is not comprised in the set of positions determined with the bounding volume, the object can be created and deactivated. Creating an object means that the object is build, e.g. the features of the instance are built. Activating an object means that the object is available for the staggered pattern of objects. It is to be understood that an activated object may be deactivated at a latter stage. Advantageously, the creation of an instance and then activation or deactivation according to the position of the instantiated object in the pattern of objects allows a same generic naming scheme of the instances to be used. This allows the interchangeability of one type of pattern to another, e.g. from a first configuration of staggered pattern of objects to a second configuration of staggered pattern of objects as illustrated below. In other words, the created and activated objects are part of the staggered pattern of objects. Additionally, in order to ensure that the object is enclosed in the bounding volume, it is determined whether or not the volume of the instantiated object is enclosed within the bounding volume. In practice, an instantiated object is enclosed in a bounding volume, and the instantiated object is activated or created if its bounding volume is totally enclosed by the bounding volume enclosing the staggered pattern.

The creation of a regular pattern is shown on FIGS. 10 and 11. On FIG. 10, a bounding box has been computed based on the initial rectangular pattern 60 and encloses partially the staggered pattern 50 of objects. The set of positions enclosed in the bounding volume is determined. Five objects 61 have a respective position that is not comprised in the set: they are outside the bounding box and therefore not activated. The term outside means that the object is out of the bounding box and does not intersect the bounding volume. FIG. 11 shows the same staggered pattern of objects as depicted on FIG. 10, but the objects 61 have not been activated (or deactivated). As they are not activated, the objects 61 cannot be displayed. The staggered pattern of objects on FIG. 11 represents a first configuration of staggered pattern of objects. A second configuration is described below.

Referring back to FIG. 1, the staggered pattern of objects is displayed (step 150).

At this step of the process, the designer can repeat the process, for instance by modifying the offset value, and/or at least one of the values used for pattern definition (steps 102, 104).

Next, at step 160, the designer triggers the shifting of the instantiated objects previously shifted with the third distance in a third direction opposite to the second direction (step 162). The shifting at step 160 is similarly performed as the shifting at step 130. In consequence, the instantiated objects previously shifted at step 130 are moved so that the initial grid of step 122 is obtained, and possibly displayed. Advantageously, the designer can easily switch from a regular pattern to a staggered pattern, and inversely. Especially, the designer does not need to modify the geometry of the staggered pattern of objects inasmuch as the shifting is carried out in relation to the reference object that is unique. The new positions can therefore be determined quickly without any additional computation. It is therefore possible for the user to quickly see the effect of a design changes. Varying the pattern configuration can easily allow study of different configurations, thus improving the ergonomy of the designing for the user. It is to be understood that the instantiated objects deactivated at step 142 will be activated before displaying the regular pattern inasmuch as they have a respective position which is comprised in the set of predetermined positions.

In alternative, the designer can trigger the shifting the instantiated objects previously shifted with a fourth distance in a third direction opposite to the second direction (step 164). The fourth distance can be defined by the designer, or defined by default. In practice, the fourth distance is chosen such that it is twice the third distance, thus forming a second configuration of staggered pattern of objects. In other terms, a second configuration can be created by decreasing the number of instances in the row of the reference object. This advantageously allows to create a second configuration of staggered pattern of objects wherein the column comprising the reference point is positioned between two others columns. As for the first configuration of staggered pattern, number of instantiated objects are activated and deactivated. Especially, when passing from the first configuration to the second one, instantiated objects that were deactivated are activated, and instantiated objects that were activated are deactivated. For instance, in reference to FIG. 10 showing a first configuration of a staggered pattern of objects according to the invention, the objects 61 are deactivated. As a result of shifting the instantiated objects in a third direction opposite to the second direction 26 with a fourth distance being twice of the third distance (the offset value 29), the five objects 61 are inside the bounding box and are therefore activated.

It is to be understood that the second configuration of staggered pattern of objects can be obtained at first: indeed, the shifting performed at step 130 can be performed with a third distance (the offset) in a direction that is opposite to the second one.

Figure 12:
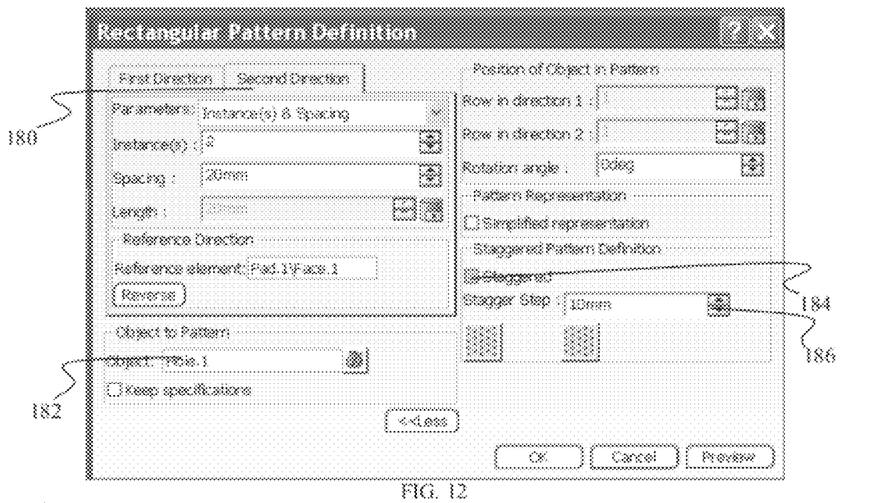
FIGS. 12-14 are illustrations of tools for configuring and/or creating a staggered pattern of objects.

Referring now to FIG. 12, a graphical user interface for displaying a user-interactive graphical tool is depicted. The user-interactive graphical tool can be displayed in a graphical user interface as the one depicted on FIG. 17. The user-interactive graphical tool is adapted for triggering upon user action the designing of a staggered pattern of objects according to the method of the invention. The user-interactive graphical tool provides several fields. One of these fields allows the user to select the reference object to be provided 182. The user can also select a tab 180 wherein fields are provided for inputting information about a direction: for a given direction, the designer can define values such that the number of instances for a given row (or column), the distance between two rows (or columns). The user-interactive graphical tool further provides a graphical mean for triggering and configuring the creation of a staggered pattern of objects 184 and defining an offset value 186, as illustrated on FIGS. 13 and 15 and FIGS. 14 and 16.

Figure 13:
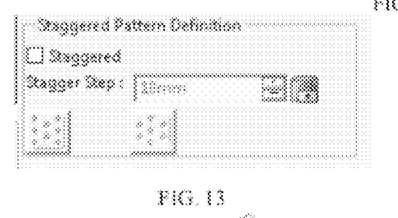

On FIG. 13, the designer does not have triggered the shifting of instantiated objects in one of every two rows of the grid. Consequently, a regular pattern is displayed, as shown on FIG. 15.

Figure 14:
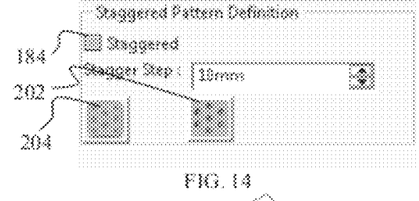
Figure 15:
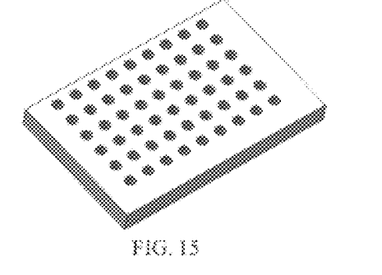
FIGS. 15-16 are illustrations of patterns of objects created according to the invention.
Figure 16:
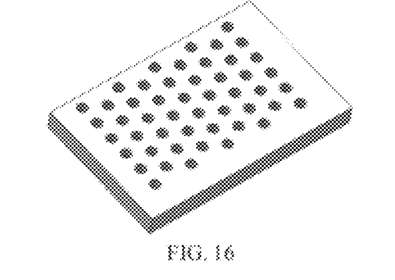

On FIG. 14, the designer has selected an offset value and triggered the displaying 184 of one of the configuration of a staggered pattern, illustrated on FIG. 16. The user can select the configuration of staggered to display 202, 204. One of the two configurations can be selected by default by the system. Advantageously, the user can obtain two configurations of staggered pattern of objects within the same user interface.

The preferred embodiment of the present invention has been described. It will be understood that various modifications may be made without departing from the spirit and scope of the invention. Therefore, other implementations are within the scope of the following claims.

The invention claimed is:

1. A computer-implemented method for designing a staggered pattern of objects in a computer-aided design system, the method comprising the steps of:
   providing a reference object to be multi-instantiated;
   instantiating objects from the reference object for forming a grid with a number of rows and a number of columns, the grid being formed so that the rows are spaced from each other using only a first distance in a first direction and each column being spaced from each other using only a second distance in a second direction;
   shifting, in one of every two rows of the grid, the instantiated objects of all the columns of said one of every two rows of the grid using only a third distance in the second direction;
   determining the respective position of each instantiated object in the staggered pattern; and
   activating each instantiated object whose respective position is comprised in a set of predetermined positions, wherein the instantiated objects have not previously been activated.

2. The computer-implemented method of claim 1, wherein the set of predetermined positions is enclosed in a bounding volume.

3. The computer-implemented method of claim 2, wherein the set of predetermined positions further comprises the positions of the instantiated objects for which the instantiated objects are totally enclosed in said bounding volume.

4. The computer-implemented method of claim 3, wherein the set of predetermined positions further comprises the positions of the instantiated objects for which each instantiated object is enclosed in an inner bounding volume that is totally enclosed within said bounding volume.

5. The computer-implemented method of claim 1, further comprising the step of:
   defining the number of objects to be instantiated from the reference object.

6. The computer-implemented method of claim 1, further comprising the step of:
   displaying the grid with a number of rows and a number of columns before the step of shifting.

7. The computer-implemented method of claim 1, further comprising the step of shifting the instantiated objects previously shifted with the third distance in a third direction opposite to the second direction.

8. The computer-implemented method of claim 1, further comprising a step of shifting the instantiated objects previously shifted with a fourth distance in a third direction opposite to the second direction, wherein the fourth distance is twice the third distance.

9. The computer-implemented method of claim 8, further comprising a step of:
assigning a value to each of the first, second, third, and fourth distances, wherein the values are numerical values with a unit of length.

10. The computer-implemented method of claim 1, further comprising a step of:
assigning a value to each of the first, second, and third distances, wherein the values are numerical values with a unit of length.

11. The computer-implemented method of claim 1, further comprising, after the step of shifting, the step of:
displaying the instantiated objects.

12. A non-transitory computer readable storage medium having recorded thereon a computer program comprising instructions for execution by a computer, the computer program being adapted for:
providing a reference object to be multi-instantiated;
instantiating objects from the reference object for forming a grid with a number of rows and a number of columns, the grid being formed so that the rows are spaced from each other using only a first distance in a first direction and each column being spaced from each other using only a second distance in a second direction;
shifting, in one of every two rows of the grid, the instantiated objects of all the columns of said one of every two rows of the grid using only a third distance in the second direction;
determining the respective position of each instantiated object in the staggered pattern; and
activating each instantiated object whose respective position is comprised in a set of predetermined positions, wherein the instantiated objects have not previously been activated.

13. A computer-aided design system comprising:
a storage system for storing a reference object to be multi-instantiated;
a graphical user interface for displaying a user-interactive graphical tool, the user-interactive graphical tool being adapted for performing the designing of a staggered pattern of objects by:
providing a reference object to be multi-instantiated;
instantiating objects from the reference object for forming a grid with a number of rows and a number of columns, the grid being formed so that the rows are spaced from each other using only a first distance in a first direction and each column being spaced from each other using only a second distance in a second direction;
shifting, in one of every two rows of the grid, the instantiated objects of all the columns of said one of every two rows of the grid using only a third distance in the second direction;
determining the respective position of each instantiated object in the staggered pattern; and
activating each instantiated object whose respective position is comprised in a set of predetermined positions, wherein the instantiated objects have not previously been activated.

* * * * *